(12) United States Patent
Edström

(10) Patent No.: US 6,763,063 B1
(45) Date of Patent: Jul. 13, 2004

(54) PEAK VALUE ESTIMATION OF SAMPLED SIGNAL

(75) Inventor: Krister Edström, Hjärup (SE)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 730 days.

(21) Appl. No.: 09/694,031

(22) Filed: Oct. 23, 2000

(51) Int. Cl.[7] .......................... H04Q 1/20; H04L 27/06; H03K 5/153; H04B 1/69

(52) U.S. Cl. .................... 375/224; 375/343; 375/143; 327/58

(58) Field of Search ................. 375/224, 343; 367/123; 369/59, 59.21, 124.05, 44.34

(56) References Cited

U.S. PATENT DOCUMENTS

| | | | |
|---|---|---|---|
| 3,943,346 A | * 3/1976 | Urkowitz et al. | 708/290 |
| 4,262,257 A | 4/1981 | Lawrence | |
| 4,868,885 A | 9/1989 | Perry | |
| 4,935,963 A | 6/1990 | Jain | |
| 5,471,396 A | * 11/1995 | White | 702/66 |
| 5,987,392 A | 11/1999 | Tucker et al. | |
| 6,445,756 B1 | * 9/2002 | Takahashi | 375/343 |
| 6,529,460 B1 | * 3/2003 | Belser | 369/59.21 |

FOREIGN PATENT DOCUMENTS

| | | |
|---|---|---|
| EP | 0648359 B1 | 4/1995 |
| WO | WO99/61925 | 12/1999 |

* cited by examiner

*Primary Examiner*—Stephen Chin
*Assistant Examiner*—Cicely Ware
(74) *Attorney, Agent, or Firm*—Burns, Doane, Swecker & Mathis, L.L.P.

(57) ABSTRACT

A peak magnitude of a signal is estimated from a set of signal samples. From the set of signal samples, a largest signal sample and an adjacent next largest signal sample are selected that occurs, respectively, at a time, $s_1$ and at a time, $s_2$. A first ratio of a first derived signal sample and a second derived signal sample is generated, the first derived signal sample being derived from the largest signal sample, and the second derived signal sample being derived from the next largest signal sample. A second ratio is determined from the first ratio, the second ratio representing a peak magnitude of a communication system response divided by a second magnitude of the communication system response, wherein the second magnitude is the communication system response at the time $s_1$. The peak magnitude of the signal is generated from the second ratio and the first derived signal sample.

24 Claims, 7 Drawing Sheets

| $R_1$ | $R_2$ | $R_1$ | $R_2$ | $R_1$ | $R_2$ | $R_1$ | $R_2$ |
|---|---|---|---|---|---|---|---|
| 1.00 | 2.34 | 1.44 | 2.00 | 2.50 | 1.65 | 6.20 | 1.31 |
| 1.05 | 2.29 | 1.53 | 1.96 | 2.70 | 1.61 | 7.70 | 1.26 |
| 1.10 | 2.24 | 1.63 | 1.91 | 3.00 | 1.56 | 10.00 | 1.21 |
| 1.15 | 2.20 | 1.77 | 1.85 | 3.40 | 1.50 | 15.00 | 1.15 |
| 1.22 | 2.15 | 1.92 | 1.80 | 3.90 | 1.45 | 25.00 | 1.10 |
| 1.29 | 2.10 | 2.10 | 1.74 | 4.50 | 1.40 | 50.00 | 1.05 |
| 1.36 | 2.05 | 2.30 | 1.69 | 5.20 | 1.36 | other | 1 |

PEAK VALUE ESTIMATION OF SAMPLED SIGNAL

BACKGROUND

The present invention relates to communication systems, and more particularly to methods and apparatuses for estimating the peak value of a sampled signal in a communications system.

In a wireless digital telecommunication system, such as a Wideband Code Division Multiple Access (W-CDMA) system, a discrete signal is sent from a transmitter to a receiver via a channel. The signals in the transmitter and the receiver are processed in a digital format, but they are in an analog format when they traverse the channel. Consequently, a typical transmitter/receiver arrangement typically has the form illustrated in FIG. 1. In the transmitter 101, the digital signal to be transmitted is supplied to a Digital-to-Analog (D/A) converter 103, which generates an analog form of the signal. The analog signal is then processed by a bandpass filter 105 to eliminate frequency components that are outside of the desired frequency spectrum to be used during the transmission. The impulse response of the bandpass filter 105 is represented herein by the function $g_1(t)$. The filtered signal is then supplied to the channel 107 (e.g., by means of an antenna—not shown).

The channel 107 has its own characteristics which further modify the signal. These characteristics may be modeled by a filter 109, having an impulse response $h(t)$. In addition to the channel's inherent characteristics, noise is usually present in the channel which also combines with the signal, as represented by the adder 111.

The channel 107 then supplies the resultant signal to the receiver 113 (e.g., by means of an antenna—not shown). The receiver 113 processes the received analog signal through a bandpass filter 115 to remove unwanted frequency components. The receiver's bandpass filter 115 has an impulse response that is represented herein by the function $g_2(t)$. The filtered received signal may then be supplied to an Analog-to-Digital converter (A/D converter) 117, which converts the signal back into a digital form (e.g., by sampling the amplitude of the filtered received signal at regular intervals of time).

FIG. 2 is a graph that depicts the relationship between an exemplary analog signal (having a continuous set of values over a period of time) and an exemplary set of sampled values, $y_x$, determined at corresponding sampling times x. The time interval, T, between consecutive sampling times is typically constant for all sampling times.

It is often important to determine the peak value(s), $y_p$, of the analog signal 201. For example, in telecommunication systems, the peak values may be used to correctly estimate signal-to-noise ratios (S/N) or, for spread spectrum systems, signal-to-interference-and-noise ratios (SINR). However, as may be seen by the example of FIG. 2, the sampled values, $y_x$, may not include a value that was determined exactly at the moment, $s_p$, that the analog signal 201 exhibited a peak value $y_p$. At best, the sampled values, $y_x$, may only include two values (e.g., the values $y_1$ and $y_2$) that were determined at respective times $s_1$ and $s_2$ that are just on either side of the peak, $y_p$.

It is possible to estimate the peak, $y_p$, simply by using the largest sample value (e.g., the value $y_1$ shown in FIG. 2) without modification. However, this approach yields results that are either more or less accurate, depending on how far the largest sample value is from the actual peak value. In general, the peak value will be underestimated. This can result in degraded performance in systems that rely on the estimated peak values, such as telecommunications that use it for estimating a SIR.

Consequently, it is desired to have techniques that more accurately estimate the peak value of an analog signal from a set of sampled values.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses for estimating a peak magnitude of a signal from a set of signal samples that have been communicated through a communication system. Making the estimation includes selecting, from the set of signal samples, a largest signal sample that occurs at a time, $s_1$; and selecting, from the set of signal samples, a next largest signal sample that is adjacent to the largest signal sample, wherein the next largest signal sample occurs at a time, $S_2$. A first ratio of a first derived signal sample and a second derived signal sample is then generated, wherein the first derived signal sample is derived from the largest signal sample, and the second derived signal sample is derived from the next largest signal sample. The first ratio is used to determine a second ratio, wherein the second ratio represents a peak magnitude of a communication system response divided by a second magnitude of the communication system response, wherein the second magnitude of the communication system response is the communication system response at the time $s_1$. The second ratio and the first derived signal sample are used to generate the peak magnitude of the signal.

In some embodiments, selecting, from the set of signal samples, the largest signal sample and the next largest signal sample that is adjacent to the largest signal sample are performed based on magnitude of the set of signal samples without regard to sign.

In some embodiments, the first derived signal sample is equal to the largest signal sample; and the second derived signal sample is equal to the next largest signal sample that is adjacent to the largest signal sample.

Using the second ratio and the first derived signal sample to generate the peak magnitude of the signal may include multiplying the second ratio by the first derived signal.

In some alternative embodiments, the first derived signal sample is generated by subtracting a noise estimate from the largest signal sample; and the second derived signal sample is generated by subtracting the noise estimate from the next largest signal sample that is adjacent to the largest signal. In such embodiments, generating the noise estimate may be performed by determining a mean value of a remaining set of signal samples from the set of signal samples.

Also in such embodiments, using the second ratio and the first derived signal sample to generate the peak magnitude of the signal may include adding the noise estimate to a product of the second ratio and the first derived signal.

In some embodiments, using the first ratio to determine the second ratio may include using the first ratio to locate the second ratio in a lookup table; and retrieving the second ratio from the lookup table.

In such embodiments, using the first ratio to locate the second ratio in the lookup table may include locating a first entry in the lookup table having stored therein the first ratio, and determining a second entry in the lookup table that is associated with the first entry, wherein the second entry in the lookup table is associated with the second ratio. Alternatively, using the first ratio to locate the second ratio in the lookup table may include locating a first entry having stored therein a nearest value that is less than the first ratio; determining a second entry in the table that is associated with the first entry; locating a third entry having stored therein a nearest value that is greater than the first ratio; determining a fourth entry in the table that is associated with the third entry; and using the first ratio, the first entry, the second entry, the third entry and the fourth entry to interpolate a value that represents the second ratio.

In another aspect of the invention, the lookup table may be generated by selecting a number, k, of values of the first ratio; and for each of the k values of the first ratio, directly calculating a corresponding value of the second ratio as a function of the first ratio. Alternatively, the lookup table may be generated by selecting a number, k, of values of candidate sample times, $s_1:s_1^1, \ldots, s_1^k$; for each of the values of the candidate sample times, using the communication system response to calculate a value of the first ratio as a function of said each value of the candidate sample time; and for each of the values of the candidate sample times, using the communication system response and the peak magnitude of the communication system response to calculate a value of the second ratio as a function of said each value of the candidate sample time.

BRIEF DESCRIPTION OF THE DRAWINGS

The objects and advantages of the invention will be understood by reading the following detailed description in conjunction with the drawings in which.

DETAILED DESCRIPTION

Figure 1:
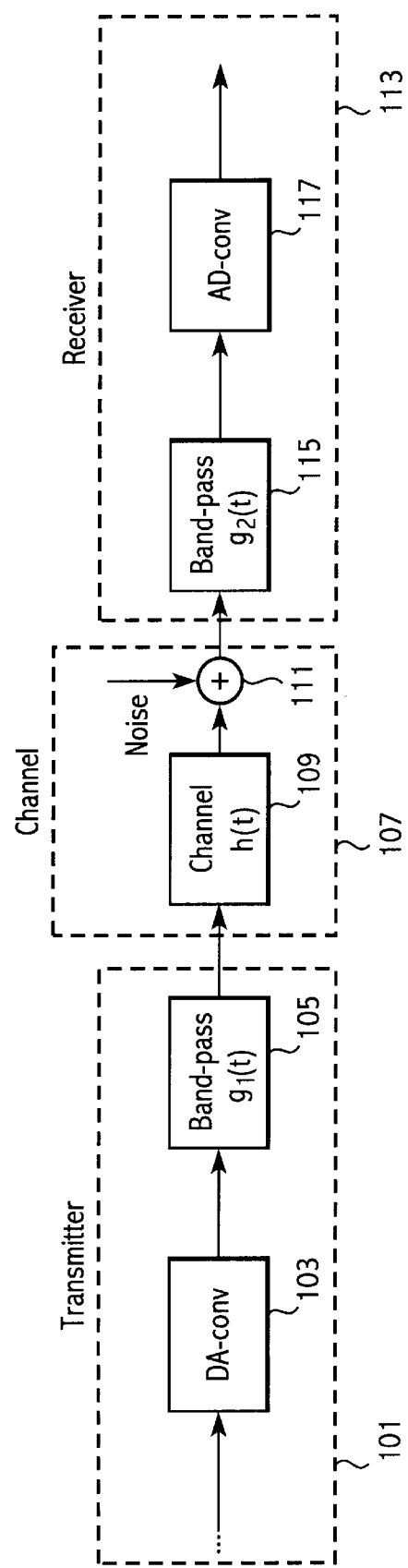
FIG. 1 is a block diagram of a typical transmitter/receiver arrangement in a communications system.
Figure 2:
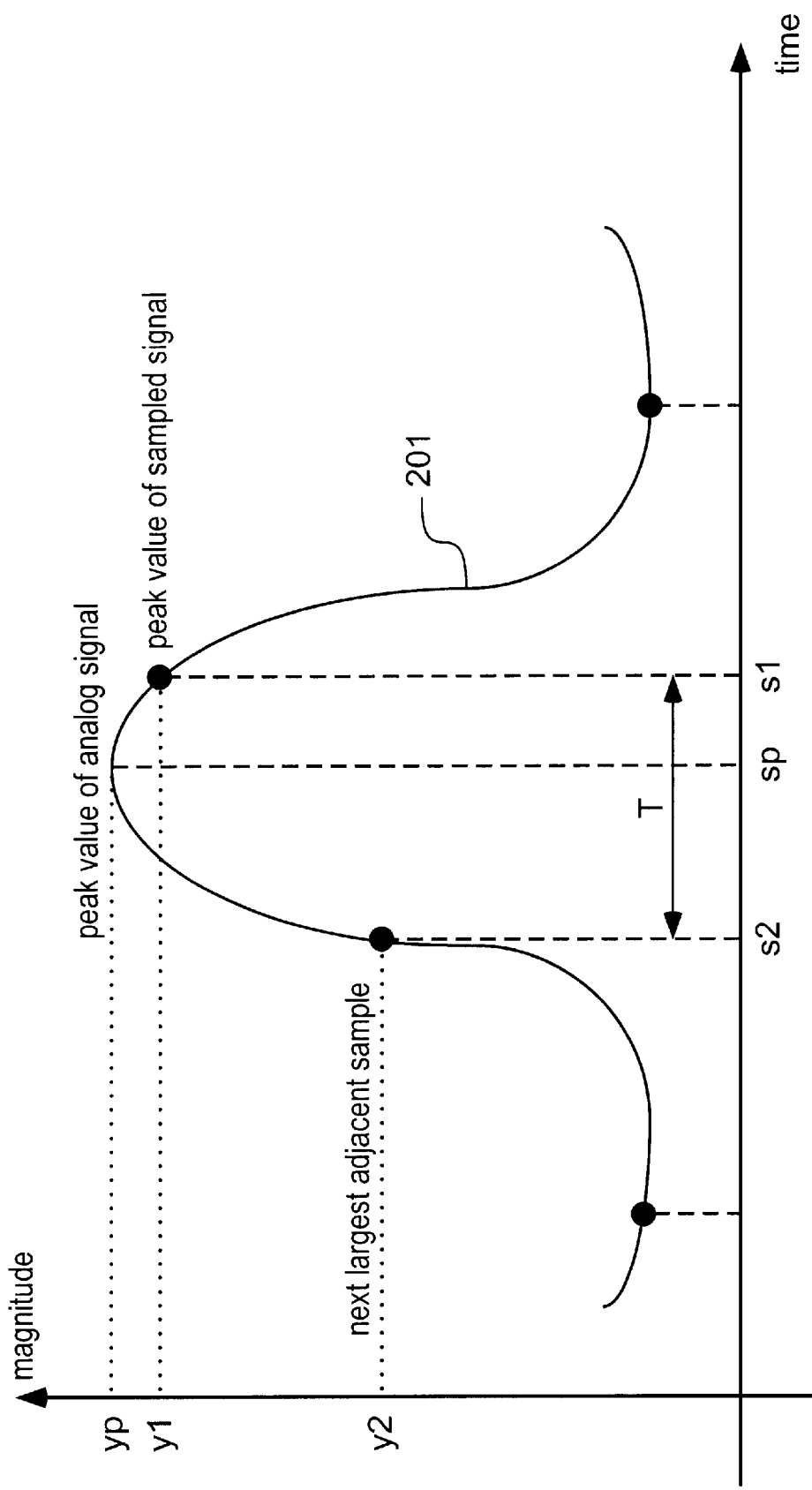
FIG. 2 is a graph that depicts the relationship between an exemplary analog signal (having a continuous set of values over a period of time) and an exemplary set of sampled values, $y_x$, determined at corresponding sampling times x.

The various features of the invention will now be described with respect to the figures, in which like parts are identified with the same reference characters.

These and other aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable storage medium having stored therein an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiment may be referred to herein as "logic configured to" perform a described action, or alternatively as "logic that" performs a described action.

The invention provides methods and apparatuses that enable a peak value of an analog signal to be estimated from only two sample points, one on each side of the peak. More particularly, the peak value of the analog signal is estimated by selecting two sample points that are considered to be on either side of the peak, and then determining a peak value estimate as a function of the relative magnitudes between the two selected sample points. Various embodiments of the invention will now be described in greater detail.

In the following discussion, the notation $y_1$ shall be used to denote the largest value of a set of signal samples, and $y_2$ shall be used to denote the second largest value of the set of signal samples that is adjacent (i.e., just before or just after) the first largest value. The samples $y_1$ and $y_2$ are considered to have been determined at respective sampling times $s_1$ and $s_2$, where $|T|=|s_1-s_2|$ is the known interval between consecutive sample points. For the sake of simplicity, only positive valued signals (and hence positive valued sample points) are considered here. However, the invention is equally applicable to negative valued samples, in which case the terms "largest" and "second largest" refer to the absolute magnitudes of those negative valued samples.

Figure 3:
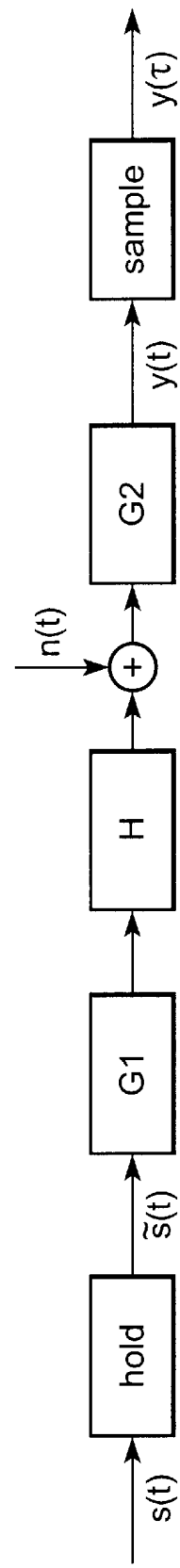
FIG. 3 is a block diagram of a communication system as considered in the frequency domain.

Referring back now to FIG. 1, it may be assumed that the impulse responses $g_1(t)$ and $g_2(t)$ of the two bandpass filters 105, 115 are known. It may also be assumed that the channel impulse response, h(t) is a constant (i.e., h(t)=a, where a is a constant) during the length of the impulse responses of $g_1(t)$ and $g_2(t)$. Transforming the various impulse responses from the time domain to the frequency domain yields a schematic picture of the system as shown in FIG. 3, and permits the system output to be expressed as follows:

$$y(\tau)=G_1(p)H(p)G_2(p)\tilde{s}(t)+G_2(p)\tilde{n}(t)|_{\tau=t_1,t_2}, \quad (1)$$

Assuming that it is possible to compensate for the noise (so that the second term in the summation drops out), and substituting a constant for the more general expression of the channel impulse response yields:

$$y(\tau)=aG_1(p)G_2(p)\tilde{s}(t)|_{\tau=t_1,t_2}, \quad (2)$$

Denoting the combined filter $G_1(p)G_2(p)$ by $G(p)$ yields:

$$y(\tau)=aG(p)\tilde{s}(t)|_{\tau=t_1,t_2}, \quad (3)$$

Since $\tilde{s}(t)$ is an impulse, we get:

$$y(\tau)=ag(t)|\tau=t_1,t_2,\ldots=ag(\tau) \quad (4)$$

Thus, the problem can be formulated as follows. Assume that the function $g(\tau)$ is known, that it is symmetric around the peak, $g(s_p)$, and that the function $g(\tau)$ is monotone in the intervals $[s_p-T]$, $(s_p+T]$. The problem, then is to find the peak value of $y(\tau)=ag(\tau)$ when two sample points ($y(s_1)$ and $y(s_2)$), one on each side of the peak, are known. The distance T between the two sample points is also assumed to be known, that is, $s_1=s_2\pm T$.

Given the above assumptions, and in accordance with an aspect of the invention, it is observed that the ratio $R_1=g(s_1)/g(s_2)$ is indicative of the distance that the sample time $s_1$ is from the unknown sample time of the peak, $s_p$, which can be expressed as $|s_p-s_1|$. (The ratio $R_1$ does not indicate the sign of this distance, due to the assumed symmetry of the signal.) For example, when $g(s_1)$ and $g(s_2)$ are the same distance from the peak, $g(s_p)$, the assumption that the signal is symmetrical about the peak means that $g(s_1)=g(s_2)$, so that $R_1=1$ (its lowest value). Similarly, if the sample value $g(s_1)$ is equal to the peak value, $g(s_p)$, the difference between $g(s_1)$ and $g(s_2)$ will be at its maximum, which means that the first ratio, $R_1$, will also be at its maximum value.

It is also observed that the time difference $|s_p-s_1|$ uniquely determines a second ratio, $R_2=g(s_p)/g(s_1)$. Since, as shown above, $|s_p-s_1|$ is a function of $s_1$ and $s_2$, the second ratio can also be expressed as $R_2=F(s_1, s_2)$, that is, $R_2$ is a function of the two sample times, $s_1$ and $s_2$, where $F(\cdot)$ is known since $g(t)$ is known. When $|s_p-s_1|=1$, $s_p=s_1$, so $R_2=1$ (its minimum value). Similarly, when $|s_p-s_1|$ is at its maximum value we have $|s_p-s_1|=T/2$, due to the assumption that the signal is symmetrical about its peak so that $s_1$, and $s_2$ are equally distant from $s_p$.

What this means is that, like the first ratio $R_1$, the second ratio $R_2$ has a predefined range of values for a given function $g(\cdot)$, and that knowing the first ratio, $R_1$ makes it possible to determine the second ratio, $R_2$. The peak value of the signal, $y(s_p)$, can then be estimated as follows: Measure the values $y(s_1)$ and $y(s_2)$ and calculate:

$$\frac{y(s_1)}{y(s_2)} = \frac{ag(s_1)}{ag(s_2)} = R_1 \quad (5)$$

Given a value for the first ratio $R_1$, it is then possible to determine a corresponding value for the second ratio $R_2$. This in turn makes it possible to calculate a value for $y(s_p)$ as follows:

$$y(s_p)ag(s_p)=aR_2g(s_1)=R_2y(s_1) \quad (6)$$

The calculated value, $y(s_p)$ will be a more accurate estimate of the peak value of the sampled signal. This, in turn, means that values that are a function of the peak value, such as SIR in communications systems (including but not limited to W-CDMA systems), will also be more accurate, resulting in better system performance.

An exemplary embodiment of the invention utilizes a table lookup operation to determine a value of $R_2$ from a measured value of $R_1$. The value of $R_2$ is then used as shown in Equation (6) to determine the estimated peak signal value, $y(s_p)$.

To create the table, we start with the fact that $g(t)$ (see Equation (4)), $s_1$, and $s_2$ are all known. With a fixed sampling period, T, we know that $s_1=s_2+T$. Now consider the case in which $s_1=s_2+T$ (the case in which $s_1=s_2-T$ is treated analogously). As noted previously, $$R_1 = \frac{g(s_1)}{g(s_2)}.$$

Hence, $$R_1 = \frac{g(s_1)}{g(s_2)} = \frac{g(s_1)}{g(s_1+T)} = F_1(s_1).$$

It is observed that $F_1$ is known because $g(\cdot)$ is known.

Now consider the case in which $F_1$ is invertible. This means that $s_1 = F_1^{-1}(R_1)$. This gives $$R_2 = \frac{g(s_p)}{g(s_1)} = \frac{g(s_p)}{g(F_1^{-1} + (R_1))}.$$

The value of $g(s_p)$ is known because it is the maximum value of $g(t)$. Hence there is an analytic relationship between $R_1$ and $R_2$ that can be used to create a table or to be used directly to calculate $R_2$ from values of $R_1$.

Now consider the case in which $F_1$ is not invertible. In this case, a table having a number, k, of entries, each relating a value of $R_1$ to a corresponding value of $R_2$, can be constructed in the following way:

Select k values of $s_1 : s_1^1, \ldots, s_1^k$.

For each k, calculate the corresponding value of $R_1 : R_1^1, \ldots, R_1^k$ and $R_2 : R_2^1, \ldots, R_2^k$, using the relationships:

$$R_1^j = \frac{g(s_1^j)}{g(s_1^j+T)}, \quad R_2^j = \frac{g(s_p)}{g(s_1^j)}, \quad j=1,\ldots,k$$

The table can then be constructed:

| $R_1$ | $R_2$ |
|---|---|
| $R_1^1$ | $R_2^1$ |
| $R_1^2$ | $R_2^2$ |
| . | . |
| . | . |
| . | . |
| $R_1^k$ | $R_7^k$ |

Figure 4:
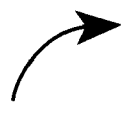
FIG. 4 is an exemplary table that associates values of a first ratio, $R_1$ with corresponding values of a second ratio, $R_2$, in accordance with an aspect of the invention.
Figure 5:
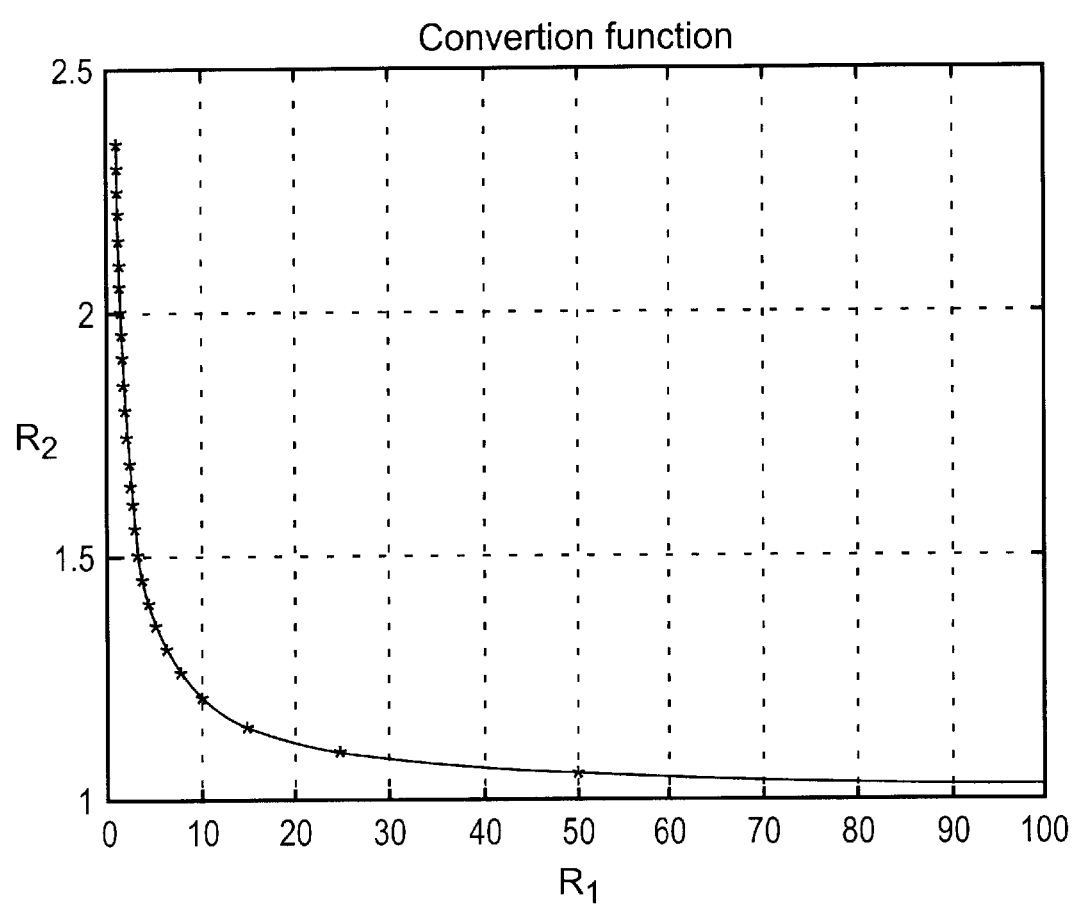
FIG. 5 is an exemplary graph that shows the second ratio, $R_2$, plotted as a function of the first ratio, $R_1$, in accordance with the invention.

It can be seen that the table is arranged such that each calculated value of $R_1$ is stored in a manner that associates it with its corresponding value of $R_2$. An exemplary table 401 is shown in FIG. 4. It will be observed that the first entry in the table 401 is for the case in which $R_1=1$, which as explained above, is the minimum value of $R_1$ and occurs when $s_1$ and $s_2$ are equidistant from $s_p$. The last entry in the table 401 covers all cases for which $R_1$ is greater than 50.00. In this example, it is unnecessary to store a plurality of entries for values of $R_1$ greater than 50.00 because the corresponding values of $R_2$ do not differ very much from one another, but instead approach closer and closer to a value of 1.00. The relationship between $R_1$ and $R_2$ is depicted in the graph shown in FIG. 5, in which $R_2$ is plotted as a function of $R_1$.

Figure 6:
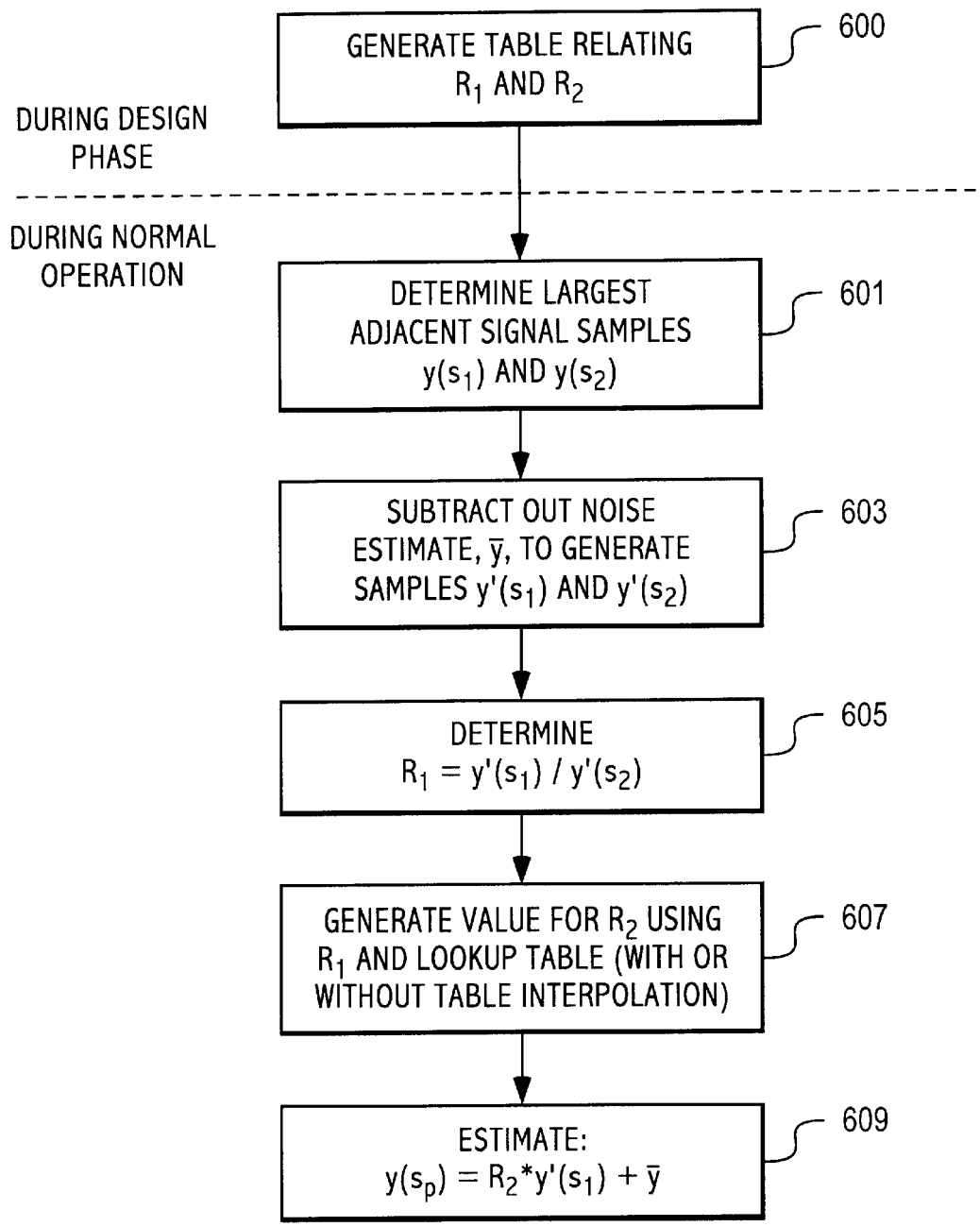
FIG. 6 is a flowchart depicting steps performed in accordance with an exemplary embodiment of the invention.

FIG. 6 is a flowchart that shows the steps to be performed in accordance with the invention. During the design of the system, a table relating values of $R_1$ to $R_2$ is formed.

Next, when the system is put into use (i.e., "during normal operation), the received set of signal samples are analyzed to determine the two samples ($y(s_1)$ and $y(s_2)$) that surround a peak (step 601). This can be done by identifying the two highest magnitude samples, as described earlier.

In practice, it is useful to remove a noise level, $\bar{y}$, from the received sample values, $y(s_1)$ and $y(s_2)$ (step 603). The noise level, $\bar{y}$ can be estimated by determining the mean value based on the samples that are not peak values in the impulse response of the channel. This gives the two highest magnitude received signals as:

$$y^1(s_1)=y(s_1)-\bar{y},\ y^1(s_2)=y(s_2)-\bar{y} \quad (7)$$

A value for the first ratio, $R_1$, is then determined as (step 605):

$$R_1 = \frac{y'(s_1)}{y'(s_2)} \quad (8)$$

A value for $R_2$ is then determined from the table (e.g., the table 401 of FIG. 4), using $R_1$ as a key for finding a table entry (step 607). In some embodiments, the value of $R_2$ may be taken as the one associated with the entry having a value of $R_1$ that most closely matches the computed value of $R_1$. In alternative embodiments, a more accurate value for $R_2$ may be estimated by interpolating between those values of $R_2$ that are associated with the two table entry values of $R_1$ that lie immediately above and below the computed value of $R_1$. It is noted that, since one has full control over the table, it can be created with any accuracy. In order to reduce the size of the table, linear interpolation can be used. As an alternative, one could fit a function to the values in the table (e.g., to use splines). In yet other alternatives, no table is used, and the value of $R_2$ is calculated dynamically from the value of $R_1$.

Having determined a value of $R_2$ from the table (either with or without interpolation as explained above), the estimated peak value of the signal can then be determined in accordance with (step 609):

$$y(s_p)=R_2 y^1(s_1)+\bar{y} \quad (9)$$

It will be observed that in Equation (9), the noise estimate, $\bar{y}$, has been added back so that the estimated peak value, $y(s_p)$, will more accurately reflect what a received sample value would have been.

Figure 7:
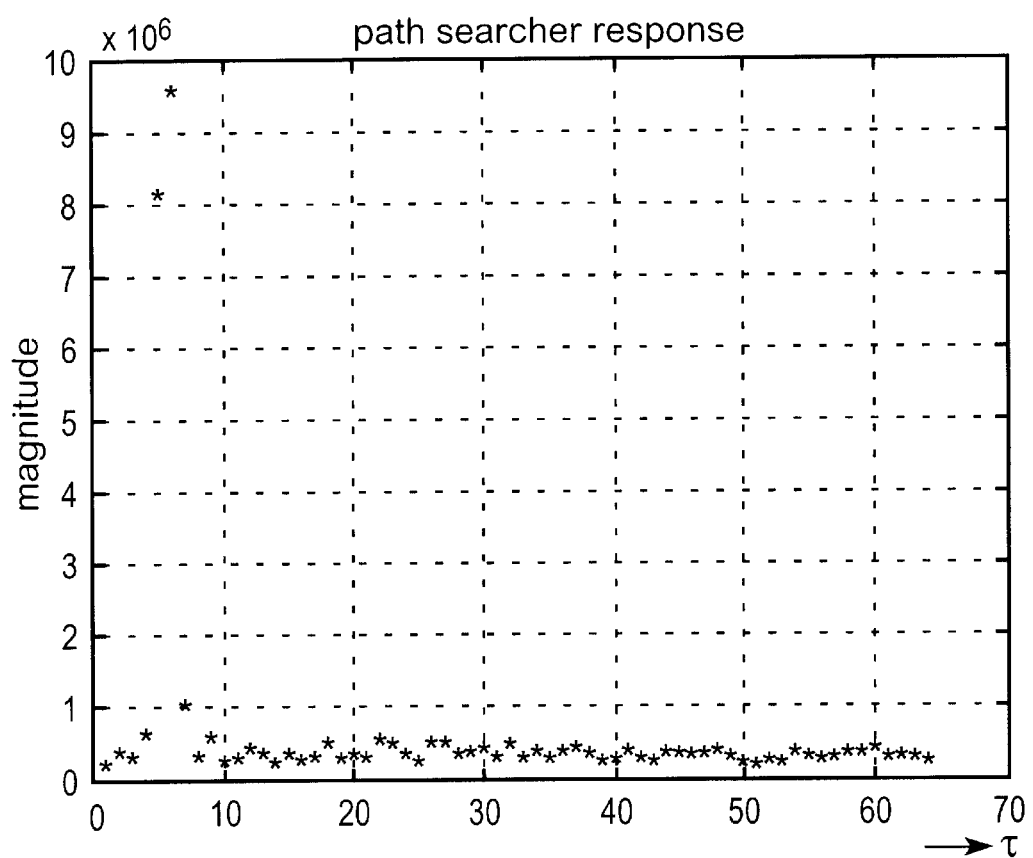
FIG. 7 is a graph showing values for an exemplary set of received signal samples.

An exemplary use of the invention will now be described. Assume that a set of received sample points are collected such as those having the values depicted in the graph of FIG. 7. The highest and next-highest magnitude values are identified as:

$$y(s_1)\approx 9.57*10^6,\ y(s_2)\approx 8.14*10^6 \quad (10)$$

The noise level can also be determined from the figure as $\bar{y}\approx 3.5*10^5$.

We can now determine:

$$y^1(s_1)=y^1(s_1)-\bar{y}=9.22*10^6,\ y^1(s_2)=y^1(s_2)-\bar{y}=7.79*10^6 \quad (11)$$

The first ratio can now be determined as:

$$R_1 = \frac{y'(s_1)}{y'(s_2)} = \frac{9.22}{7.79} \approx 1.18 \quad (12)$$

From the table (see, e.g., table 401 in FIG. 4) we find $R_2\approx 2.18$. Hence, $$y(s_p)=R_2*y^1(s_1)+\bar{y}=9.22\cdot 10^6*2.18+3.5\cdot 10^5=2.04\cdot 10^7 \quad (13)$$

One could then use this value in determining, for example, a SIR. It is noted that the values used in Equation (13) were found empirically. In other tests, there were instances in which $s_1\approx s_p$. From these cases, it was shown that the actual peak value was approximately $2.1\cdot 10^7$.

The invention has been described with reference to a particular embodiment. However, it will be readily apparent to those skilled in the art that it is possible to embody the invention in specific forms other than those of the preferred embodiment described above. This may be done without departing from the spirit of the invention.

For example, it is possible that in some embodiments, further improved estimates can be obtained by determining an estimated peak value in accordance with:

$$y(s_p)=R_2^\alpha y(s_1)+\bar{y},\ 0.9<\alpha<1.1 \quad (14)$$

Selection of a suitable value for $\alpha$ should be made empirically.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method of estimating a peak magnitude of a signal from a set of signal samples that have been communicated through a communication system, comprising:

selecting, from the set of signal samples, a largest signal sample that occurs at a time, $s_1$;

selecting, from the set of signal samples, a next largest signal sample that is adjacent to the largest signal sample, wherein the next largest signal sample occurs at a time, $s_2$;

generating a first ratio of a first derived signal sample and a second derived signal sample, wherein the first derived signal sample is derived from the largest signal sample, and the second derived signal sample is derived from the next largest signal sample;

using the first ratio to determine a second ratio, wherein the second ratio represents a peak magnitude of a communication system response divided by a second magnitude of the communication system response, wherein the second magnitude of the communication system response is the communication system response at the time $s_1$; and using the second ratio and the first derived signal sample to generate the peak magnitude of the signal.

2. The method of claim 1, wherein the steps of selecting, from the set of signal samples, the largest signal sample and the next largest signal sample that is adjacent to the largest signal sample are performed based on magnitude of the set of signal samples without regard to sign.

3. The method of claim 1, wherein:

the first derived signal sample is equal to the largest signal sample; and the second derived signal sample is equal to the next largest signal sample that is adjacent to the largest signal sample.

4. The method of claim 3, wherein the step of using the second ratio and the first derived signal sample to generate the peak magnitude of the signal comprises multiplying the second ratio by the first derived signal.

5. The method of claim 1, wherein:

the first derived signal sample is generated by subtracting a noise estimate from the largest signal sample; and the second derived signal sample is generated by subtracting the noise estimate from the next largest signal sample that is adjacent to the largest signal.

6. The method of claim 5, further comprising:
generating the noise estimate by determining a mean value of a remaining set of signal samples from the set of signal samples.

7. The method of claim 5, wherein the step of using the second ratio and the first derived signal sample to generate the peak magnitude of the signal comprises adding the noise estimate to a product of the second ratio and the first derived signal.

8. The method of claim 1, wherein the step of using the first ratio to determine the second ratio comprises:
using the first ratio to locate the second ratio in a lookup table; and
retrieving the second ratio from the lookup table.

9. The method of claim 8, wherein the step of using the first ratio to locate the second ratio in the lookup table comprises locating a first entry in the lookup table having stored therein the first ratio, and determining a second entry in the lookup table that is associated with the first entry, wherein the second entry in the lookup table is associated with the second ratio.

10. The method of claim 8, wherein the step of using the first ratio to locate the second ratio in the lookup table comprises:
locating a first entry having stored therein a nearest value that is less than the first ratio;
determining a second entry in the table that is associated with the first entry;
locating a third entry having stored therein a nearest value that is greater than the first ratio;
determining a fourth entry in the table that is associated with the third entry; and
using the first ratio, the first entry, the second entry, the third entry and the fourth entry to interpolate a value that represents the second ratio.

11. The method of claim 8, further comprising:
initially generating the lookup table by:
selecting a number, k, of values of the first ratio; and
for each of the k values of the first ratio, directly calculating a corresponding value of the second ratio as a function of the first ratio.

12. The method of claim 8, further comprising:
initially generating the lookup table by:
selecting a number, k, of values of candidate sample times, $s_1:s_1^1, \ldots, s_1^k$;
for each of the values of the candidate sample times, using the communication system response to calculate a value of the first ratio as a function of said each value of the candidate sample time; and
for each of the values of the candidate sample times, using the communication system response and the peak magnitude of the communication system response to calculate a value of the second ratio as a function of said each value of the candidate sample time.

13. An apparatus that estimates a peak magnitude of a signal from a set of signal samples that have been communicated through a communication system, comprising:
logic that selects, from the set of signal samples, a largest signal sample that occurs at a time, $s_1$;
logic that selects, from the set of signal samples, a next largest signal sample that is adjacent to the largest signal sample, wherein the next largest signal sample occurs at a time, $s_2$;
logic that generates a first ratio of a first derived signal sample and a second derived signal sample, wherein the first derived signal sample is derived from the largest signal sample, and the second derived signal sample is derived from the next largest signal sample;
logic that uses the first ratio to determine a second ratio, wherein the second ratio represents a peak magnitude of a communication system response divided by a second-magnitude of the communication system response, wherein the second magnitude of the communication system response is the communication system response at the time $s_1$; and
logic that uses the second ratio and the first derived signal sample to generate the peak magnitude of the signal.

14. The apparatus of claim 13, wherein the logic that selects, from the set of signal samples, the largest signal sample and the logic that selects, from the set of signal samples, the next largest signal sample that is adjacent to the largest signal sample base their operation on magnitude of the set of signal samples without regard to sign.

15. The apparatus of claim 13, wherein:
the first derived signal sample is equal to the largest signal sample; and
the second derived signal sample is equal to the next largest signal sample that is adjacent to the largest signal sample.

16. The apparatus of claim 15, wherein the logic that uses the second ratio and the first derived signal sample to generate the peak magnitude of the signal comprises logic that multiplies the second ratio by the first derived signal.

17. The apparatus of claim 13, further comprising:
logic that generates the first derived signal sample by subtracting a noise estimate from the largest signal sample; and
logic that generates the second derived signal sample by subtracting the noise estimate from the next largest signal sample that is adjacent to the largest signal.

18. The apparatus of claim 17, further comprising:
logic that generates the noise estimate by determining a mean value of a remaining set of signal samples from the set of signal samples.

19. The apparatus of claim 17, wherein the logic that uses the second ratio and the first derived signal sample to generate the peak magnitude of the signal comprises logic that adds the noise estimate to a product of the second ratio and the first derived signal.

20. The apparatus of claim 13, wherein the logic that uses the first ratio to determine the second ratio comprises:
logic that uses the first ratio to locate the second ratio in a lookup table; and
logic that retrieves the second ratio from the lookup table.

21. The apparatus of claim 20, wherein the logic that uses the first ratio to locate the second ratio in the lookup table comprises logic that:
locates a first entry in the lookup table having stored therein the first ratio; and
determines a second entry in the lookup table that is associated with the first entry, wherein the second entry in the lookup table is associated with the second ratio.

22. The apparatus of claim 20, wherein the logic that uses the first ratio to locate the second ratio in the lookup table comprises:
logic that locates a first entry having stored therein a nearest value that is less than the first ratio;

logic that determines a second entry in the table that is associated with the first entry;

logic that locates a third entry having stored therein a nearest value that greater than the first ratio;

logic that determines a fourth entry in the table that is associated with the third entry; and logic that uses the first ratio, the first entry, the second entry, the third entry and the fourth entry to interpolate a value that represents the second ratio.

23. The apparatus of claim 20, further comprising:

logic that generates the lookup table by:
  selecting a number, k, of values of the first ratio; and
  for each of the k values of the first ratio, directly calculating a corresponding value of the second ratio as a function of the first ratio.

24. The apparatus of claim 20, further comprising:

logic that generates the lookup table by:
  selecting a number, k, of values of candidate sample times, $s_1:s_1^1, \ldots, s_1^k$;
  for each of the values of the candidate sample times, using the communication system response to calculate a value of the first ratio as a function of said each value of the candidate sample time; and
  for each of the values of the candidate sample times, using the communication system response and the peak magnitude of the communication system response to calculate a value of the second ratio as a function of said each value of the candidate sample time.

* * * * *